(12) United States Patent
Laou et al.

(10) Patent No.: US 7,247,850 B2
(45) Date of Patent: Jul. 24, 2007

(54) INFRARED IMAGER

(75) Inventors: Philips Laou, Sainte-Foy (CA); Linh Ngo Phong, Brossard (CA)

(73) Assignee: Her Majesty the Queen in right of Canada, as represented by the Minister of National Defence of her Majesty's Canadian Government, Ottawa (CA)

( * ) Notice: Subject to any disclaimer, the term of this patent is extended or adjusted under 35 U.S.C. 154(b) by 20 days.

(21) Appl. No.: 11/197,325

(22) Filed: Aug. 5, 2005

(65) Prior Publication Data

US 2007/0029482 A1 Feb. 8, 2007

(51) Int. Cl.
*G01J 5/02* (2006.01)
(52) U.S. Cl. .................................... 250/332
(58) Field of Classification Search ............. 250/332
See application file for complete search history.

(56) References Cited

U.S. PATENT DOCUMENTS

| | | | | |
|---|---|---|---|---|
| 5,036,197 A | * | 7/1991 | Voles | 250/332 |
| 5,389,788 A | * | 2/1995 | Grinberg et al. | 250/331 |
| 5,710,428 A | * | 1/1998 | Ko | 250/332 |
| 6,198,098 B1 | * | 3/2001 | Laou | 250/338.1 |

* cited by examiner

*Primary Examiner*—Constantine Hannaher
(74) *Attorney, Agent, or Firm*—Stites & Harbison PLLC; Ross F. Hunt, Jr.

(57) ABSTRACT

An infrared imager for detecting infrared (IR) radiation of a scene in a field of view (FOV) of an optical system and converting the IR into a visible image wherein the imager consists of an array of uncooled microbolometers in a focal plane of the optical system and a array of light emitting diode (LED) or liquid crystal display (LCD) elements. The IR radiation collected by the microbolometer produces a change in an electrical output applied to electronic circuitry connected to the array of LEDs or LCDs. The electronic circuitry controls the intensity of a LED element or the reflectance of an LCD element. As a result, the imager converts the infrared radiation from the scene into visible light. The light reflected from the LCD or produced by LEDs in an array constitutes the scene image.

8 Claims, 6 Drawing Sheets

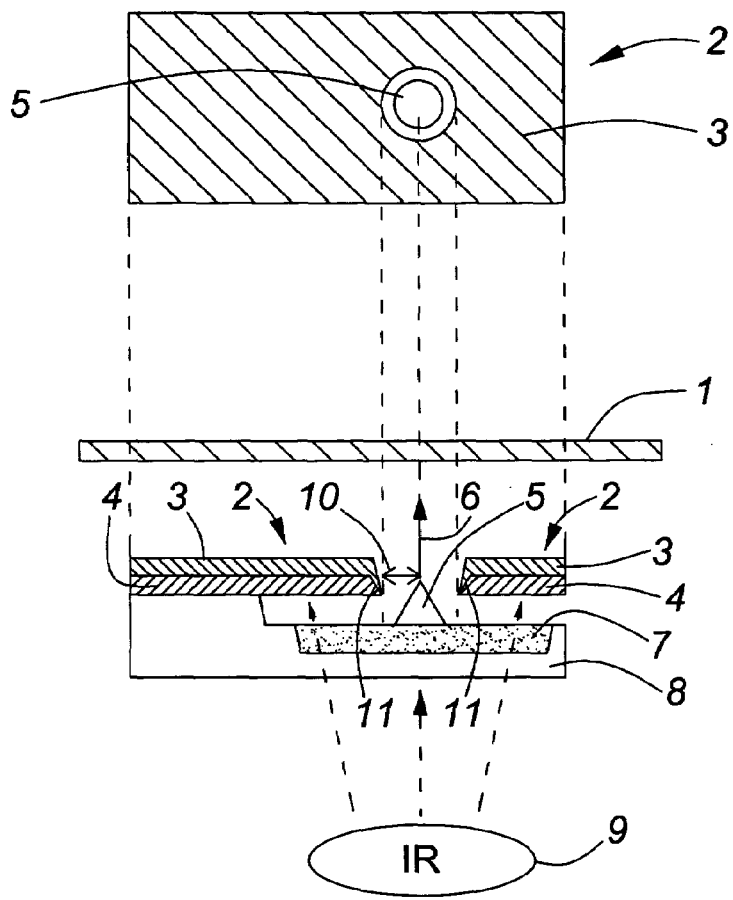
FIG. 1A
(PRIOR ART)
FIG. 1B
(PRIOR ART)
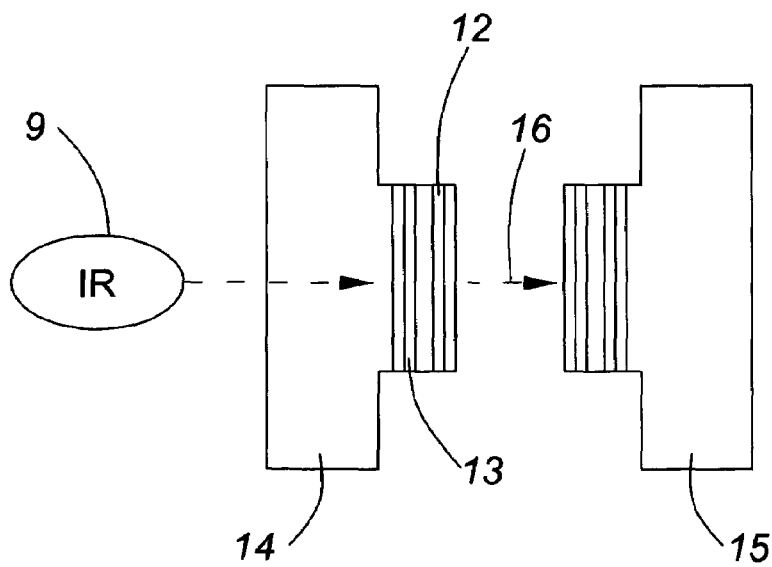
FIG. 2
(PRIOR ART)

INFRARED IMAGER

FIELD OF THE INVENTION

The present invention relates generally to an infrared imager having an array of uncooled microbolometers containing a layer of infrared (IR) sensitive material which upon absorption of infrared (IR) radiation modulates a visual display to provide a visible image, according to the amount of IR radiation absorbed by each microbolometer and, in particular, to an imager that provides a direct conversion of infrared radiation of a scene into a visible one for observation.

BACKGROUND OF THE INVENTION

Infrared imagers are becoming increasingly important for commercial and non-commercial applications such as night vision imaging. However, the imagers are still not widely used due to cost, size, weight and power consumption. For example, traditional night vision imagers, such as cryogenically cooled HgCdTe or InSb focal plane array imagers, uncooled bolometer or pyroelectric thermal imagers, require intervening electronics to convert the absorbed infrared radiation to a visible display. These additional electronics and display apparatuses incur additional cost, along with increased size, weight and power consumption.

There are a few proposed solutions to remove and/or minimize the electronics to the display for infrared imagers. For example, a direct view infrared structure was disclosed in U.S. Pat. No. 6,140,646, by Heinz Busta et al wherein an electrode on a cantilever, made of two layers of material or bi-material, with different thermal expansion coefficients, is used to modulate electron emissions from an array of field emissive devices. These emitted electrons then bombard a phosphor plate, giving a visible image. When IR radiation is incident on the bi-material cantilever, which usually consists of a layer of conductive film and a layer of insulator having different thermal expansion coefficients, the cantilever bends as its temperature rises in response to absorbed infrared radiation. This bending changes the distance between an electrode (the conductive film) and an associated emitter. As a result, the electric field established between that electrode and associated emitter changes and the amount of emitted electrons is modulated. There are a few obvious disadvantages to this approach. Among these, field emitters generally requires a large voltage, (a turn-on voltage), to achieve significant emission. The turn-on voltage is on the order of a few tenths of volts with extremely sharp emitters and small emitter-gate distance that are less than 1 μm. This turn-on voltage is not standard to CMOS technology. The turn-on voltage also creates an electrostatic force between the cantilever and the substrate. This electrostatic force may pull or collapse the cantilever if the turn-on voltage cannot be kept low. Second, field emission devices usually are not operated in a DC mode but in duty cycles or pulse mode to preserve the lifetime of the emitters and to establish emission stability. This requirement creates extra difficulties for the electronics. Third, moving parts always add uncertain reliability to the system, especially in a harsh environment. Fourth, the radiation has to pass through the substrate in order to reach the cantilever structure and, as a result, at least 50% of the radiation is lost. Fifth, high vacuum packaging is needed for field emission devices to provide a mean-free-path for the emitted electrons to reach the phosphor plate.

Another proposal was disclosed in U.S. Pat. No. 6,028,323 by Hui-Chun Liu, wherein the intensity of a LED is modulated by a quantum well infrared photodetector (QWIP) to provide a direct conversion from infrared to near infrared or visible radiation. Both a LED and an QWIP are fabricated on a GaAs-based semiconductor substrate. When infrared radiation illuminates the substrate, a fraction of the radiation is absorbed by the QWIP. The electrical resistance of the QWIP varies as a result according to the amount of absorbed radiation. This variation modulates the intensity of the LED. A CCD camera is used to capture emitted radiation from the LED. This proposal suffers a few drawbacks. First, the operation of QWIPs requires cryocoolers, which are sizable and power hungry. Second, the LED of this proposal is buried under the surface. Emitted light from the LED is severely diverged when it reaches the top layer. This makes the coupling between the QWIP-LED to the CCD camera difficult. Third, at least 50% of the incident radiation is lost in the substrate before reaching the QWIP. A third proposal was addressed in U.S. Pat. No. 6,080,988, wherein an optically reflective surface on a cantilever, which has a bi-material configuration with different thermal expansion coefficients for each layer, is used to modulate a reflected light beam. When IR radiation passes through the substrate and is absorbed by the bi-material cantilever, the bi-material cantilever bends as its temperature rises in response to absorbed IR radiation. A visible light source illuminates the reflective surface with a beam. The bending of the cantilever changes the angle of reflection of beam. One reflected beam has a different intensity than a beam reflected at a different angle when observed at a distant point. This method has no electronics and it requires no wiring. However, similar to the previous approaches, this method carries the shortcomings of power loss in the substrate and unreliability of moving parts. Due to extremely small bending of the cantilever, either the size of the overall setup is large or multiple lens and pinholes are required in order to obtain a viewable image.

Accordingly, an improved night vision imager which provides a direct visible image when converting infrared radiation, which has no moving parts and has an infrared absorber directly facing the incident radiation, and a LED array directly emitting light from its surface without any optical diverging effects, requiring no cryocooler, could have a major impact on future imaging and surveillance systems.

SUMMARY OF THE INVENTION

It is an object of the invention to provide an improved infrared imager with minimum electronics to convert the absorbed infrared radiation into a visible display.

It is also an object of the invention to provide an infrared imager which has an integrated LCD or LED array unit for visible image display.

It is a further object of the invention to provide an infrared imager that is compact, reliable, and converts infrared radiation directly to a visible image.

An infrared imager according to one embodiment of the present invention to convert an infrared image from a scene to a visible image has an array of bolometers on a substrate, each bolometer comprising a supporting layer with pillars supporting that supporting layer above said substrate, a layer of infrared sensitive material being located on said supporting layer on a side of the supporting layer remote from said substrate, electronic circuitry on the substrate being connected to each end of the infrared sensitive material via electrodes, signals being processed by the electronic circuitry as the infrared sensitive material is subjected to infrared radiation, which signals are applied to a visual display element to alter the brightness of visual display element and provide a visual indication of the amount of infrared radiation that is received by the infrared sensitive material.

DESCRIPTION OF THE DRAWINGS

FIG. 1a is a top view of a cantilever for infrared absorption and a field emitter according to a known infrared imager.

FIG. 1b is a cross sectional view of a cantilever for infrared absorption and a field emitter according to the infrared imager shown in FIG. 1a.

FIG. 2 is a cross sectional view of the QWIP-LED for converting infrared to near infrared or visible light according to a known infrared imager.

Corresponding numericals and symbols in the different figures refer to corresponding parts unless otherwise indicated.

DETAILED DESCRIPTION OF THE INVENTION

Figure 3:
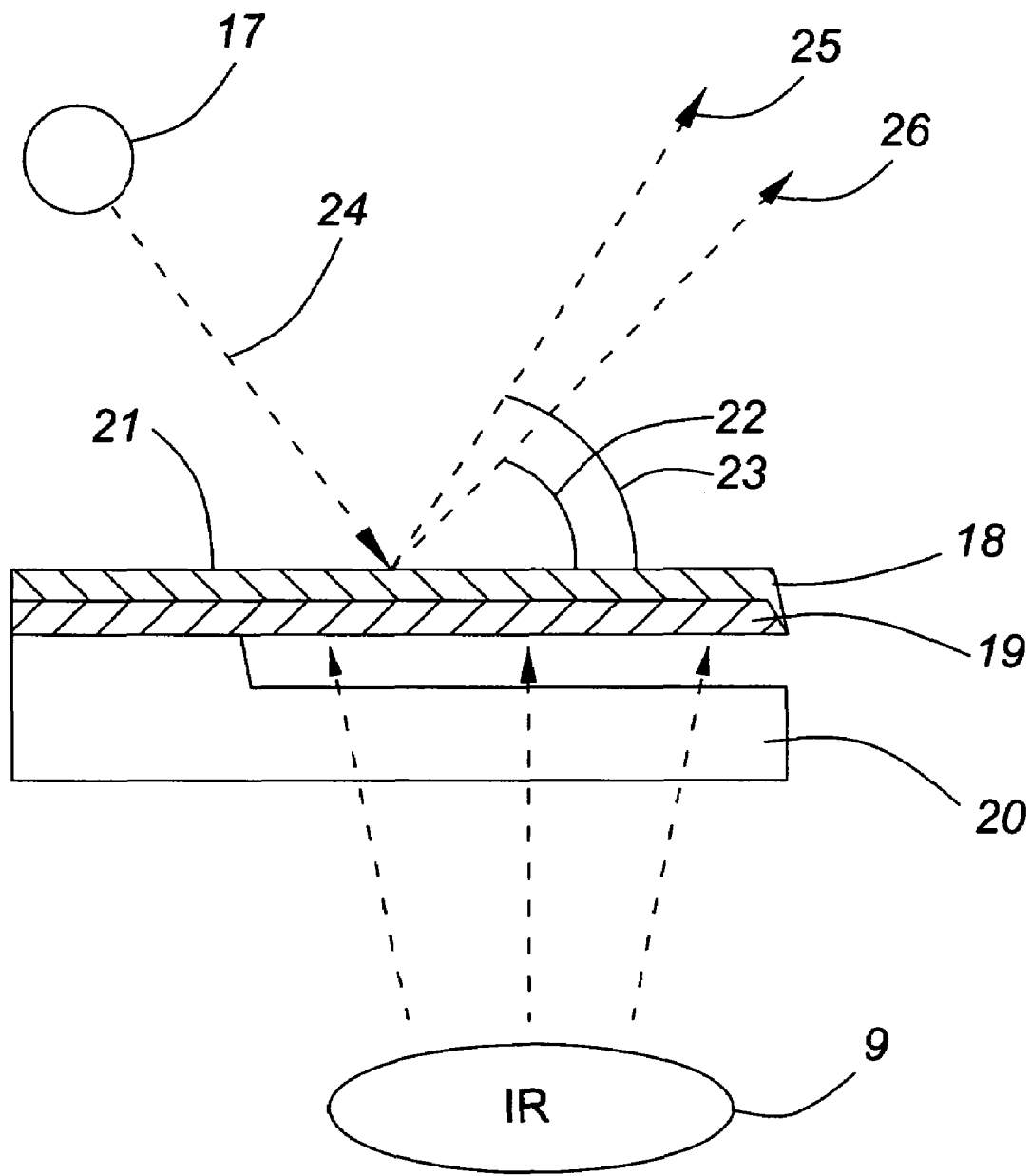
FIG. 3 is a cross sectional view of a cantilever for infrared absorption and visible light reflection according to another known infrared imager.

There are a few proposed solutions to minimize the electronics and visually display an image for infrared imagers. For example, a direct view infrared structure was disclosed in U.S. Pat. No. 6,140,646, by Heinz Busta et al wherein an electrode 11 on a cantilever 2, which is made of two layers 3 and 4 of material or bi-material, with different thermal expansion coefficients, is used to modulate electron emissions from an array of field emitters 5 as illustrated in FIG. 1b. The emitted electrons (arrow 6) then bombard a phosphor plate 1, giving a visible image. FIG. 1b shows a cross sectional view of that configuration whereas FIG. 1a is a top view. When IR radiation is incident on the bi-material cantilever 2, which usually consists of a layer of conductive film 3 and a layer of insulator 4 having different thermal expansion coefficients, the cantilever 2 bends as its temperature rises in response to absorbed infrared radiation. This bending changes the distance 10 between the electrode 11 and an associated emitter 5. As a result, the electric field established between that electrode 11 and associated emitter 5 changes and the amount of emitted electrons (arrow 6) is modulated. There are a few obvious disadvantages to this approach. Among these, field emitters generally requires a large voltage, turn-on voltage, to achieve significant emission. The turn-on voltage is on the order of a few tenths of a volt with extremely sharp emitters and small emitter-gate distance that are less than 1 μm. This turn-on voltage is not standard to CMOS technology. The turn-on voltage also creates an electrostatic force between the cantilever 2 and the substrate 8. This electrostatic force may pull or collapse the cantilever 2 if the turn-on voltage cannot be kept low. Second, field emission devices usually are not operated in a DC mode but in duty cycles or pulse mode to preserve the lifetime of the emitters and to establish emission stability. This requirement creates extra difficulties for the electronics. Third, moving parts always add uncertain reliability to the system, especially in a harsh environment. Fourth, the radiation has to pass through the substrate in order to reach the cantilever structure and at least 50% of the radiation is lost. Fifth, high vacuum packaging is needed for field emission devices to provide a mean-free-path for the emitted electrons to reach the phosphor plate 1.

Another proposal was disclosed in U.S. Pat. No. 6,028,323 by Hui-Chun Liu, wherein the intensity of a LED 12 is modulated by a quantum well infrared photodetector (QWIP) 13 to provide a direct conversion from infrared to near infrared or visible radiation. Both a LED 12 and an QWIP 13 are fabricated on a GaAs-based semiconductor 14 substrate as illustrated in FIG. 2. When infrared radiation source 9 illuminates the substrate 14, a fraction of the radiation is absorbed by the QWIP 13. The electrical resistance of the QWIP 13 varies, as a result, according to the amount of absorbed radiation. This variation modulates the intensity of the LED 12. A CCD camera 15 is used to capture emitted radiation 16 from the LED 12. This proposal suffers a few drawbacks. First, the operation of QWIPs requires cryocoolers, which are sizable and power hungry. Second, the LED 12 of this proposal is buried under the surface. Emitted light from the LED 12 is severely diverged when it reaches the top layer. This makes the coupling between the QWIP-LED to the CCD 15 camera difficult. Third, at least 50% of the incident radiation is lost in the substrate before reaching the QWIP 13.

A third proposal was addressed in U.S. Pat. No. 6,080,988, wherein an optically reflective surface 18 (see FIG. 3) on a cantilever 21, which has a bi-material configuration and different thermal expansion coefficients for each layer 18 and 19, is used to modulate a reflected light beams 25 and 26. FIG. 3 is a cross sectional view of this known configuration for one pixel. When IR radiation passes through substrate 20 and is absorbed by the bi-material cantilever 21, with a difference of thermal expansion coefficients of the two layers 18 and 19, the bi-material cantilever 21 bends as its temperature rises in response to the absorbed IR radiation. A visible light source 17 illuminates the reflective surface 18 with a beam 24. The bending of the cantilever 21 changes the angle of reflection of beam 24. Reflected beam 25 has a different intensity than reflected beam 26 when observed at a distant point. This method has no electronics and it requires no wiring. However, similar to the previous approaches, this method has the shortcomings of power loss in the substrate and unreliability of moving parts. Due to extremely small bending of the cantilever, either the size of the overall setup is large or multiple lens and pinholes are required in order to obtain a viewable image.

Accordingly, an improved night vision imager which provides a direct visible image for infrared radiation, which has no moving parts and has an infrared absorber directly facing the incident radiation, which has an LED array directly emitting from its surface without any optical diverging effects, which requires no cryocooler, could have a major impact on future imaging and surveillance systems. The present invention is directed to overcome the shortcomings of the conventional technology, and the costs associated with the supplemental systems required in the conventional technology, by providing an infrared imager that converts infrared radiation directly to a visible image with minimum electronics, compactness and reliability.

The present invention is directed to an infrared imager that provides a direct visible image from infrared radiation which is compact and reliable by integrating a bolometer array with an LED or LCD array. In a first preferred embodiment, the bolometer array is fabricated on one side of a substrate that faces received infrared radiation with an optical system focusing an image of a scene onto the array. The bolometer includes a surface member with the surface member being suspended over the surface of a substrate by the two pillars as an air bridge structure. A layer of infrared sensitive material which has its electrical resistance changed as the temperature of the material changes in response to the infrared energy impinging on the material is formed on the surface member's outerside. Thus, in response to the change of resistance, by connecting the infrared sensitive material to a constant voltage supply, the electrical current through the material varies in accordance with the infrared energy sensed by the material or by connecting the infrared sensitive material to a constant current supply, the electrical voltage across the material will vary in accordance with the infrared energy sensed by the material. A monolithic electronic circuit connected to two electrical contacts at the proximate ends on the infrared sensitive material is used to amplify and produce an output signal representative of the infrared energy impinging on the material. This signal is then sent through vias in the substrate to drive an LED element to provide a visual display element fabricated on the opposite side of the substrate.

In a second embodiment of the invention, instead of sending the signal to the LED element through the substrate on which the bolometer array was fabricated, electrical connections are made to a separate substrate on which the LED element was fabricated. The intensity or brightness of the LED varies according to the amount of infrared radiation received by the infrared sensitive material.

The LED in the first and second embodiments consists of a thin layer of organic electroluminescent molecules or polymers sandwiched between two electrodes. When electrical current is passed through it, electrons and holes are thereby injected into the system. These electrons and holes jump from molecule to molecule until an electron and a hole both find themselves on the same molecule and form an exciton. The exciton then decays and emits light.

In a third embodiment of the invention, an electrical signal from a bolometer is sent to drive an LCD element fabricated on the opposite side of the substrate through vias. In a fourth embodiment, instead of sending the signal to the LCD element through the substrate on which the bolometer array was fabricated, electrical connections are made to a separate substrate on which the LCD element was fabricated. The gray level of the LCD varies according to the amount of infrared radiation reaching the infrared sensitive material.

The LCD in the third and fourth embodiments consists of a thin liquid crystal layer sandwiched between two polyimide layers sandwiched between one transparent electrode on top and one mirror. The mirror also acts as an electrode.

The physical orientation of the liquid crystal molecules changes with the applied voltage, affecting the polarization of the light passing through them. When molecules are vertical with respect to the array plane, incident light polarization is not affected and light passes through the liquid crystal unaffected. When the liquid crystal molecules are horizontal with the plane, incident light polarization is altered. At intermediate rotations, partial light passes through. Thus, the amount of light transmitted is dependent on the degree of rotated polarization. In this way, a LCD display acts as an array of independently alterable polarizers, adjusting the angle of rotation of incident light, and generating a gray-scale image. The intensity of the LED or the gray level of the LCD varies according to the amount of infrared radiation received by the infrared sensitive material. This is a one-to-one direct mapping of infrared intensity to visible light and a visible image is generated from an infrared scene.

In the preferred embodiments, the suspended surface member may be silicon dioxide or silicon nitride and the infrared sensitive material may be made of nickel iron alloy, amorphous silicon, germanium, a layer of low temperature superconductors or high temperature superconductors. This layer of infrared sensitive material may also be metal oxides, which maximize temperature coefficient of resistance (TCR) such as vanadium oxide. The substrate may be silicon, germanium, compound semiconductors such as GaAs or GaInP. The substrate may also be glass, quartz, metal oxides or ceramics. The organic electroluminescent molecules of the LED may be precursors to homopolymer and copolymer ployphenylene vinylenes (PPVs) or any other organic electroluminescent polymers. The electrodes may be indium tin oxide (ITO) or any metals. The liquid crystal may be Licristal™ by EM Chemicals and the polyimide may be PI2555 Pyralin Polyimide from HD Microsystems.

For the above preferred embodiments of the invention, an image in electronic form can be established by coupling the LED or LCD array to a CCD camera.

The making and use of the preferred embodiments are discussed below in more detail. The specific embodiments discussed are merely illustrative of specific ways to make and use the invention, and are not intended to limit the scope of the invention.

Figure 4A:
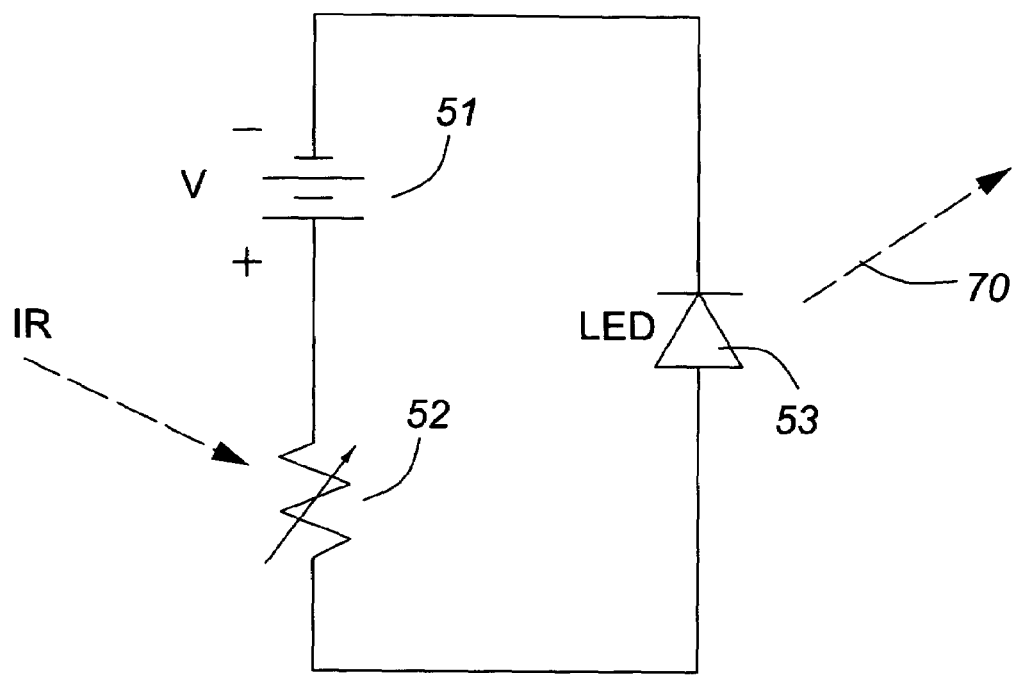
FIG. 4a is a circuit representation of a first embodiment of the present invention using a bolometer to drive an light emitting diode (LED) element.
Figure 5A:
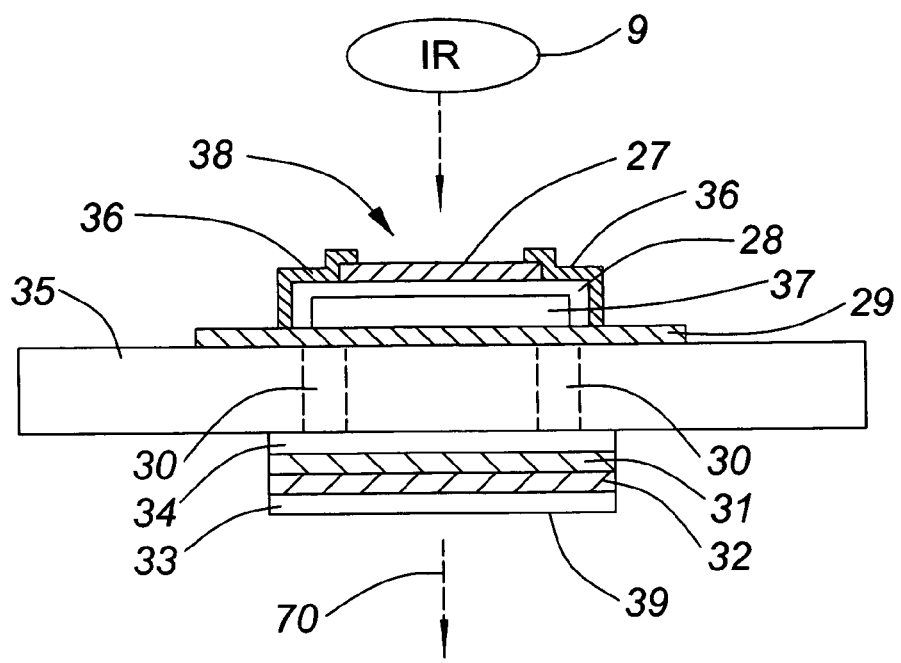
FIG. 5a is a cross sectional view of a bolometer and LED fabricated on a substrate according to a first embodiment of the present invention.

FIG. 4a is a circuit representation of a first embodiment of the present invention using a bolometer 52 to drive a light emitting diode (LED) 53 element, and FIG. 5a is a cross sectional view of one pixel of that first embodiment of the invention. In this structure there is a supporting layer 28 on which there is a layer of infrared sensitive material 27 the resistance of which varies in response to infrared radiation 9 received by layer 27. The supporting layer 28 and infrared sensitive layer 27 form a transducer structure 38 which is suspended by pillars about 2 µm from the substrate 35. The substrate 35 includes electronic circuitry 29 on its surface such as diodes, amplifiers, current sources, transistors, bus lines, connections and contact pads, etc. to process electrical signals. The fabrication of these components follows conventional IC technology or thin film transistor technology. The electronic circuitry 29 is connected at proximate ends to the infrared sensitive material layer 27 through electrodes 36, one electrode 36 to each end of layer 27 . In the case of using an LED, electrical current is sent through vias 30 in substrate 35 to the thin film LED 39 which is located on the other side of the substrate 35. The thin film LED 39 consists of an electrode 34 on which there are a layer of conductive polymer 31, a thin layer of organic electroluminescent polymer 32 and a thin transparent electrode 33 through which visible light 70 is transmitted forming a visible image generated by a number of pixels.

Figure 5B:
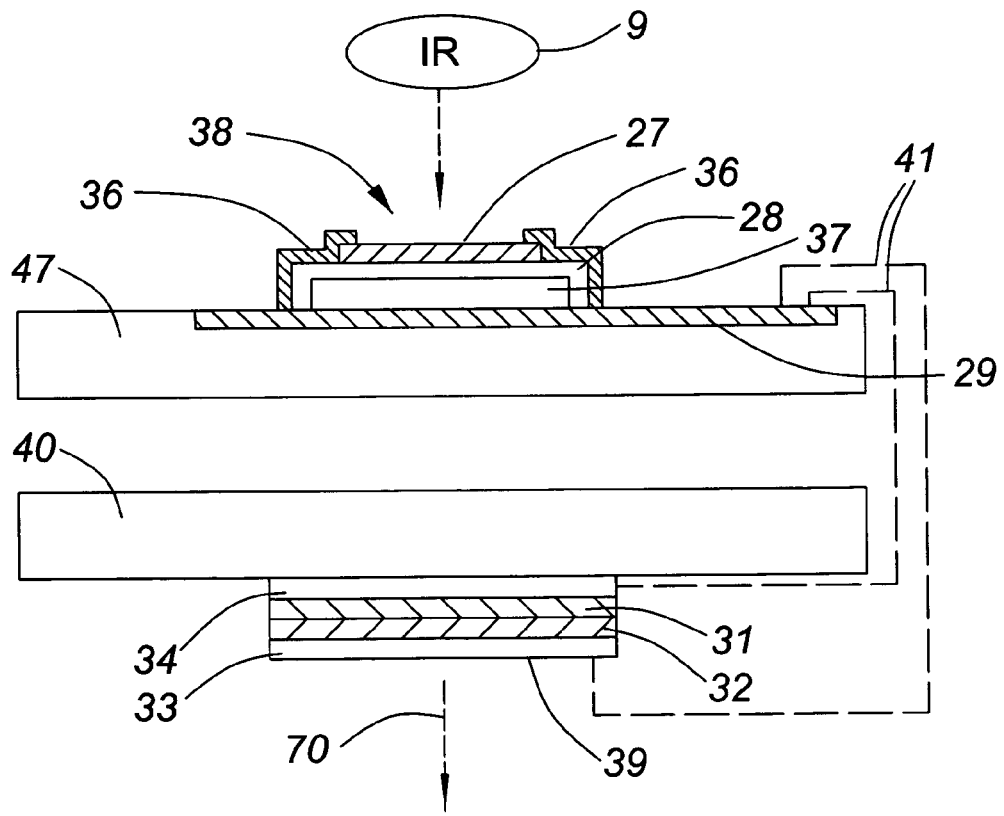
FIG. 5b is a cross sectional view of a bolometer and LED fabricated on separate substrates according to a second embodiment of the present invention.

FIG. 5b illustrates in cross section a second embodiment of the invention wherein transducer structure 38 is suspended about 2 μm from the substrate 47. The transducer structure 38 is the same as the structure 38 illustrated in FIG. 5a.

The substrate 47 in the second embodiment includes electronic circuitry 29 such as diodes, amplifiers, current sources, transistors, bus lines, connections and contact pads, etc. to process electrical signals. The fabrication of these components follows conventional IC technology or thin film transistor technology. The electronic circuitry 29 is connected at proximate ends to the infrared sensitive material layer 27 through electrodes 36, one electrode to each end of layer 27. The thin film LED 39 is fabricated on a separate substrate 40 in the second embodiment. The electrical signal of the electronic circuitry 29 is sent through external electrical connections 41 to the LED 39, which is similar to LED 39 in FIG. 5a.

In that first and second embodiments of the invention, the supporting layer 28 is an insulator formed of silicon nitride with a thickness on the order of 0.6 μm and the infrared sensitive material layer 27 was YBaCuO with a thickness on the order of 0.2 μm. The electrodes 36 are gold with a thickness on the order of 0.15 μm. The electrode 34 was Al with a thickness on the order of 0.1 μm. The conductive polymer 31 was polyethylene dioxythiophene/polystyrene sulphonate (PEDT/PSS) with a thickness on the order of 0.1 μm. The thin layer of organic electroluminescent polymer 32 is precursors to homopolymer and copolymer ployphenylene vinylenes (PPVs) with a thickness on the order of 0.1 μm and the thin transparent electrode 33 was indium tin oxide (ITO) with a thickness on the order of 0.1 μm. According to the first embodiment of the invention, the substrate 35 was glass with a thickness on the order of 1 mm. According to the other embodiment shown in FIG. 5b, the substrate 47 was silicon and the substrate 40 was glass with a thickness on the order of 1 mm. The external electrical connections 41 are Au or Al.

Figure 4B:
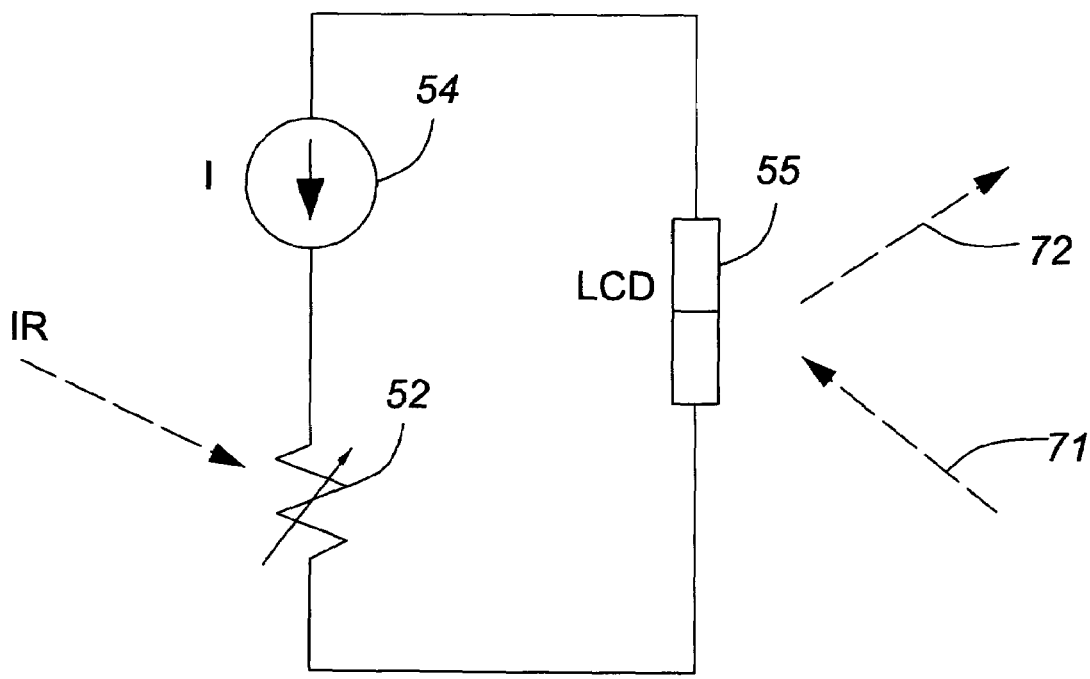
FIG. 4b is a circuit representation of an embodiment of the present invention using a bolometer to drive a liquid crystal display (LCD) element.
Figure 6A:
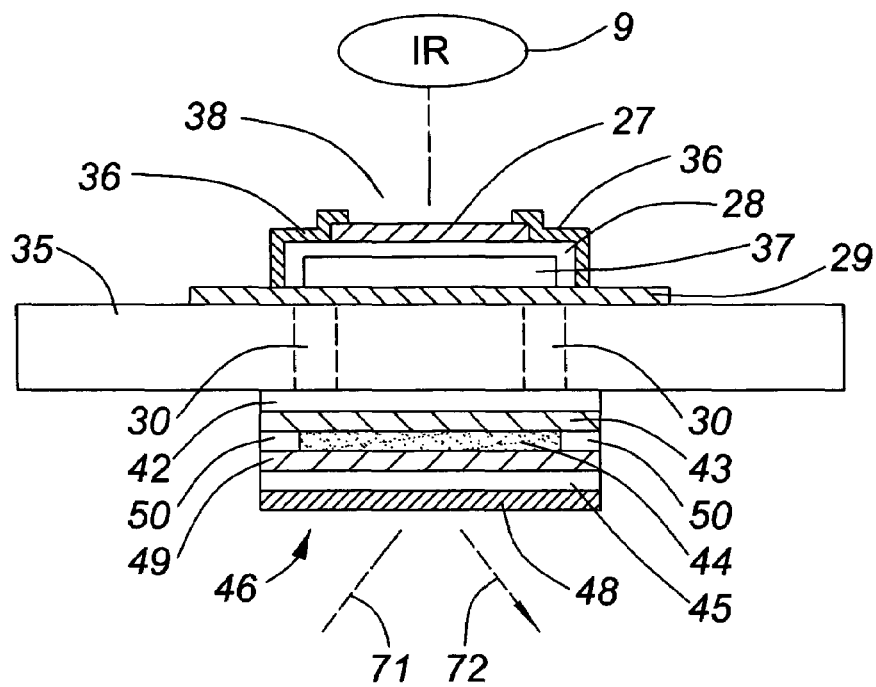
FIG. 6a is a cross sectional view of a bolometer and LCD fabricated on a substrate according to a further embodiment of the present invention.

FIG. 4b is a circuit representation of a further embodiment of the present invention using a bolometer 52 to drive an LCD 55 element and FIG. 6a is a cross sectional view of one pixel of this further embodiment of the invention. In this structure there is a supporting layer 28 on which there is a layer of infrared sensitive material 27 similar to ones in FIGS. 5a and 5b. The supporting layer 28 and infrared sensitive material layer 27 form the transducer structure 38 which is suspended by pillars about 2 μm from a substrate 35. The substrate 35 includes the electronic circuitry 29 on its surface such as diodes, amplifiers, current sources, transistors, bus lines, connections and contact pads, etc. to process electrical signals. The fabrication of these components follows conventional IC technology or thin film transistor technology. The electronic circuitry 29 is connected at proximate ends onto the infrared sensitive material layer 27 through electrodes 36, one electrode to each end of layer 27. In this further embodiment, a liquid crystal display (LCD) is used and electrical voltage to drive the display is sent through vias 30 in substrate 35 to the thin film LCD 46 which is located on the other side of the substrate 35. The thin film LCD 46 consists of an electrode 42 on which there are a first layer of polyimide 43, a thin layer of liquid crystal 44, for which a cavity is established by spacers 50, a second thin layer of polyimide 49, a transparent electrode 45 and a glass layer 48.

Figure 6B:
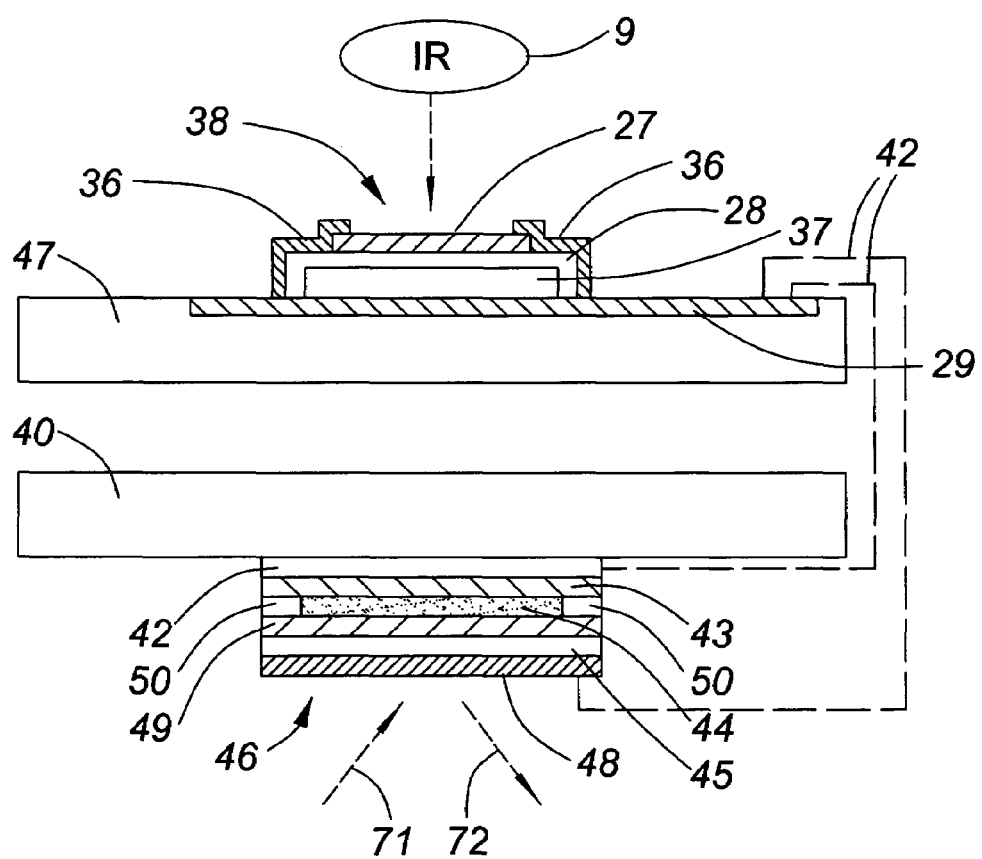
FIG. 6b is a cross sectional view of a bolometer and LCD fabricated on separate substrates according to a still further embodiment of the present invention.

FIG. 6b illustrates still another embodiment of the invention. In this embodiment the transducer structure 38 is suspended about 2 μm from the substrate 47 by pillars. The structure 38 being the same as structure 38 in FIGS. 6a, 5a and 5b.

The substrate 47 includes the electronic circuitry 29 such as diodes, amplifiers, current sources, transistors, bus lines, connections and contact pads, etc. to process electrical signals. The fabrication of these components follows conventional IC technology or thin film transistor technology. The electronic circuitry 29 is connected at the proximate ends to the infrared sensitive material layer 27 through electrodes 36, one electrode to each end of layer 27. The thin film LCD 46 is fabricated on a separate substrate 40. The electrical signal of the electronic circuitry 29 is sent through external electrical connections 42 to the LCD 46.

According to the last two described embodiments of the invention, the supporting layer 28 was an insulator such as silicon nitride with a thickness on the order of 0.6 μm and the infrared sensitive layer 27 was YBaCuO with a thickness on the order of 0.2 μm. The electrodes 36 are gold with a thickness on the order of 0.15 μm. The electrode 42 was Al with a thickness on the order of 0.1 μm. The thin layer of liquid crystal 44 was Licristal™ by EM Chemicals with a thickness on the order of 10 μm and the polyimide is PI2555 Pyralin Polyimide from HD Microsystems with a thickness on the order of 1 μm. The thin transparent electrode 45 was indium tin oxide (ITO) with a thickness on the order of 0.1 μm. The glass layer 48 shown in FIGS. 6a and 6b has a thickness on the order of 1 mm. In the embodiments of the invention in FIG. 6a, the substrate 35 was glass with a thickness on the order of 1 mm. According to the embodiment of the invention illustrated in FIG. 6b, the substrate 47 was silicon. The substrate 40 was glass with a thickness on the order of 1 mm. The external electrical connections 42 are Au or Al.

Figure 7:
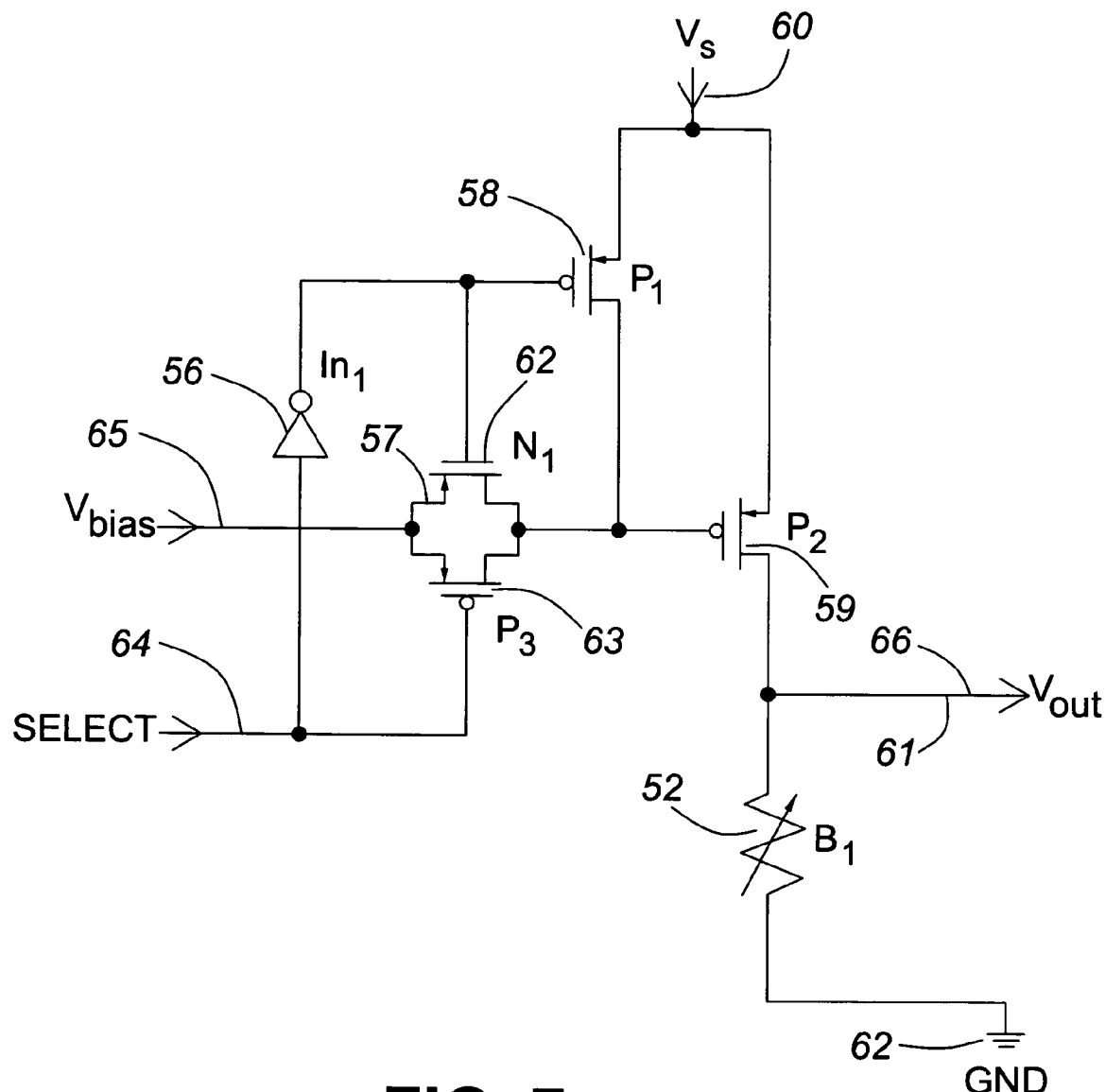
FIG. 7 is an example of electronic circuitry for each bolometer pixel according to the present invention.

FIG. 7 shows an example of the electronic circuitry 29 for the above described embodiments. A current source, Transistor 59 supplies current to Bolometer 52 according to the biasing voltage, $V_{bias}$. A Select signal at 64 switches between $V_{bias}$ at 65 and voltage $V_s$ at 60 to Transistor 59 using Transistors 58, 62, 63 and Invertor 56. When an active low is applied to Select at 64, Transistor 58 is open and both 62 and 63 closed. As a result, the current source is turned on with $V_{bias}$ at 65 supplied to Transistor 59. When an active high is sent to Select at 64, Transistor 58 is closed and both 62 and 63 are open. As a result, $V_s$ at 60 is connected to Transistor 59 and the current source is turned off. The voltage $V_{out}$ at 66 depends on the change of the resistance of Bolometer 52.

It should be noted that although particular materials have been selected for different embodiments of the invention, other materials can also be used. For example, the suspended surface member 28 may be silicon dioxide and the infrared sensitive material 27 may be made of nickel iron alloy, amorphous silicon, germanium, or a layer of low temperature superconductor or high temperature superconductor. This layer of infrared sensitive material 27 may also be metal oxide, which maximizes temperature coefficient of resistance (TCR) such as vanadium oxide. The substrate 47 may be germanium, compound semiconductors such as GaAs or GaInP. The substrates may also be quartz, metal oxides or ceramics. The organic electroluminescent molecules of the LED may be precursors to homopolymer and copolymer ployphenylene vinylenes (PPVs) or any other organic electroluminescent polymers and the electrodes may be indium tin oxide (ITO) or any metals.

The thermodetector of the described embodiments of the invention may be any types of thermodetector such as bolometric and pyroelectric.

It should be further noted that although the description is basically in terms of individual bolometer cell or pixel integrated to an LED or LCD element, the invention may use any x,y array assembly of adjoining pixels forming an imaging or mosaic detector array.

Different configurations may further improve the infrared sensitivity, conversion efficiency and LED or LCD power efficiency to optimize the performance of the imager.

Various modifications may be made to the preferred embodiments described without departing from the spirit and scope of the invention as defined in the appended claims.

The invention claimed is:

1. An infrared imager to convert an infrared image from a scene to a visible image, said imager comprising an array of bolometers on a substrate, each bolometer comprising a supporting layer and pillars supporting said supporting layer above said substrate and said imager further comprising a layer of infrared sensitive material located on said supporting layer on a side of the supporting layer remote from said substrate, electronic circuitry, disposed on the substrate and connected to each end of the infrared sensitive material via electrodes, for processing signals produced as the infrared sensitive material is subjected to infrared radiation, and a visual display element to which said signals are applied and the brightness of which provides a visual indication of the amount of infrared radiation received by the infrared sensitive material, said visual display element being mounted on said substrate and comprising a thin film organic light emitting diode.

2. An infrared imager as defined in claim 1, wherein the visual display element is located on a surface of the substrate opposite to that on which the bolometer is located and the electronic circuitry is connected to the visual display element through vias in the substrate.

3. An infrared imager as defined in claim 1, wherein the visual display element is located on a separate substrate and the electronic circuitry is connected to the visual display element by external electrical connections.

4. An infrared imager as defined in claim 1, wherein the supporting layer is suspended about 2 µm above the substrate by two pillars.

5. An infrared imager as defined in claim 4, wherein the visual display element is located on a surface of the substrate opposite to that on which the bolometer is located and the electronic circuitry is connected to the visual display element through vias in the substrate.

6. An infrared imager as defined in claim 1 wherein the layer of the infrared sensitive material is selected from the group of nickel iron alloy, amorphous silicon, germanium, and metal oxides.

7. An infrared imager to convert an infrared image from a scene to a visible image, said imager comprising an array of bolometers on a substrate, each bolometer comprising a supporting layer and pillars supporting said supporting layer above said substrate and said imager further comprising a layer of infrared sensitive material located on said supporting layer on a side of the supporting layer remote from said substrate, electronic circuitry, disposed on the substrate and connected to each end of the infrared sensitive material via electrodes, for processing signals produced as the infrared sensitive material is subjected to infrared radiation, and a visual display element to which said signals are applied and the brightness of which provides a visual indication of the amount of infrared radiation received by the infrared sensitive material, said visual display element being mounted on said substrate and comprising a thin film organic liquid crystal display.

8. An infrared imager to convert an infrared image from a scene to a visible image, said imager comprising an array of bolometers on a substrate, each bolometer comprising a supporting layer and pillars supporting said supporting layer above said substrate and said imager further comprising a layer of infrared sensitive material located on said supporting layer on a side of the supporting layer remote from said substrate, monolithic electronic circuitry, disposed on the substrate and connected to each end of the infrared sensitive material via electrodes, for processing signals produced as the infrared sensitive material is subjected to infrared radiation, and a visual display element to which said signals are applied and the brightness of which provides a visual indication of the amount of infrared radiation received by the infrared sensitive material, said visual display element being disposed on a second substrate and being connected to said electronic circuitry by external electrical connections, and said visual display element comprising one of a thin film organic light emitting diode and a thin film organic liquid crystal display.

* * * * *